(12) United States Patent
Shi et al.

(10) Patent No.: US 7,645,704 B2
(45) Date of Patent: Jan. 12, 2010

(54) METHODS AND APPARATUS OF ETCH PROCESS CONTROL IN FABRICATIONS OF MICROSTRUCTURES

(75) Inventors: Hongqin Shi, San Jose, CA (US); Gregory P. Schaadt, Santa Clara, CA (US)

(73) Assignee: Texas Instruments Incorporated, Dallas, TX (US)

( * ) Notice: Subject to any disclaimer, the term of this patent is extended or adjusted under 35 U.S.C. 154(b) by 272 days.

(21) Appl. No.: 10/666,671

(22) Filed: Sep. 17, 2003

(65) Prior Publication Data

US 2005/0059254 A1    Mar. 17, 2005

(51) Int. Cl.
*H01L 21/302* (2006.01)
(52) U.S. Cl. .......................... 438/706; 438/9; 438/714; 438/723; 134/1.1
(58) Field of Classification Search ................ 438/706, 438/710, 712, 714, 715, 720, 735, 739, 8, 438/9, 723; 134/1.1, 1.2
See application file for complete search history.

(56) References Cited

U.S. PATENT DOCUMENTS

| | | | |
|---|---|---|---|
| 3,511,727 A | 5/1970 | Hays | |
| 4,190,488 A | 2/1980 | Winters | |
| 4,310,380 A | 1/1982 | Flamm et al. | |
| 4,498,953 A | 2/1985 | Cook et al. | |
| 4,551,197 A | 11/1985 | Guilmette et al. | |
| 4,695,700 A | 9/1987 | Provence et al. | |
| 4,740,410 A | 4/1988 | Muller et al. | |
| 4,749,440 A | 6/1988 | Blackwood et al. | |
| 4,789,426 A | 12/1988 | Pipkin | |
| 5,206,471 A | 4/1993 | Smith | |
| 5,330,301 A | 7/1994 | Brancher | |
| 5,439,553 A | 8/1995 | Grant et al. | |
| 5,534,107 A | 7/1996 | Gray et al. | |
| 5,672,242 A | 9/1997 | Jen | |

(Continued)

FOREIGN PATENT DOCUMENTS

EP    0704884 A2    4/1996

(Continued)

OTHER PUBLICATIONS

Aliev et al., "Development of Si(100) Surface Roughness at the Initial Stage of Etching in F2 and XeF2 Gases. Ellipsometric Study", Surface Science 442 (1999), pp. 206-214.

(Continued)

*Primary Examiner*—Lan Vinh
(74) *Attorney, Agent, or Firm*—Charles A. Brill; Wade James Brady, III; Frederick J. Telecky, Jr.

(57) ABSTRACT

The present invention provides a method for removing sacrificial materials in fabrications of microstructures using a selected spontaneous vapor phase chemical etchants. During the etching process, an amount of the etchant is fed into an etch chamber for removing the sacrificial material. Additional amount of the etchant are fed into the etch chamber according to a detection of an amount or an amount of an etching product so as to maintaining a substantially constant etching rate of the sacrificial materials inside the etch chamber. Accordingly, an etching system is provided for removing the sacrificial materials based on the disclosed etching method.

37 Claims, 6 Drawing Sheets

U.S. PATENT DOCUMENTS

| | | | |
|---|---|---|---|
| 5,716,495 A | 2/1998 | Butterbaugh et al. | |
| 5,726,480 A | 3/1998 | Pister | |
| 5,753,073 A | 5/1998 | Jen | |
| 5,757,456 A | 5/1998 | Yamazaki et al. | |
| 5,835,256 A | 11/1998 | Huibers | |
| 5,858,065 A | 1/1999 | Li et al. | |
| 6,022,456 A | 2/2000 | Manning | |
| 6,051,503 A | 4/2000 | Bhardwaj | |
| 6,115,172 A | 9/2000 | Jeong | |
| 6,126,585 A * | 10/2000 | Norwood et al. | 493/159 |
| 6,159,851 A * | 12/2000 | Chen et al. | 438/669 |
| 6,162,367 A | 12/2000 | Tai et al. | |
| 6,197,610 B1 | 3/2001 | Toda | |
| 6,204,080 B1 | 3/2001 | Hwang | |
| 6,238,581 B1 | 5/2001 | Hawkins et al. | |
| 6,277,173 B1 | 8/2001 | Sadakata et al. | |
| 6,290,864 B1 | 9/2001 | Patel et al. | |
| 6,299,724 B1 * | 10/2001 | Fayfield et al. | 156/345.29 |
| 6,328,801 B1 | 12/2001 | Gary et al. | |
| 6,334,928 B1 | 1/2002 | Sekine et al. | |
| 6,355,181 B1 | 3/2002 | McQuarrie | |
| 6,396,619 B1 | 5/2002 | Huibers et al. | |
| 6,409,866 B1 | 6/2002 | McQuarrie et al. | |
| 6,409,876 B1 | 6/2002 | McQuarrie et al. | |
| 6,436,229 B2 * | 8/2002 | Tai et al. | 257/E21.218 |
| 6,500,356 B2 | 12/2002 | Goto et al. | |
| 6,518,194 B2 * | 2/2003 | Winningham et al. | 438/717 |
| 6,558,559 B1 | 5/2003 | Becker et al. | |
| 6,576,489 B2 | 6/2003 | Leung | |
| 6,666,979 B2 * | 12/2003 | Chinn et al. | 216/2 |
| 6,740,247 B1 * | 5/2004 | Han et al. | 216/73 |
| 6,784,108 B1 * | 8/2004 | Donohoe et al. | 438/706 |
| 6,893,974 B1 * | 5/2005 | Sedigh et al. | 438/714 |
| 2001/0002663 A1 | 6/2001 | Tai et al. | |
| 2002/0011463 A1 * | 1/2002 | Buskirk et al. | 216/64 |
| 2002/0033229 A1 * | 3/2002 | Lebouitz et al. | 156/345 |
| 2002/0047172 A1 | 4/2002 | Reid | |
| 2002/0121502 A1 | 9/2002 | Patel et al. | |
| 2002/0163051 A1 | 11/2002 | Gopal | |
| 2002/0164879 A1 | 11/2002 | Leung et al. | |
| 2002/0179569 A1 * | 12/2002 | Outka et al. | 216/67 |
| 2002/0185699 A1 | 12/2002 | Reid | |
| 2002/0195423 A1 | 12/2002 | Patel et al. | |
| 2002/0196524 A1 | 12/2002 | Huibers et al. | |
| 2003/0054588 A1 | 3/2003 | Patel et al. | |
| 2003/0071015 A1 | 4/2003 | Chinn et al. | |
| 2003/0077878 A1 | 4/2003 | Kumar | |
| 2003/0080082 A1 | 5/2003 | Chinn et al. | |
| 2003/0124848 A1 | 7/2003 | Chinn et al. | |
| 2003/0166342 A1 | 9/2003 | Chinn et al. | |
| 2003/0219986 A1 | 11/2003 | Rattner | |
| 2004/0035821 A1 | 2/2004 | Doan et al. | |
| 2004/0069747 A1 | 4/2004 | Patel et al. | |
| 2004/0165250 A1 | 8/2004 | Aubuchon | |

FOREIGN PATENT DOCUMENTS

| | | |
|---|---|---|
| EP | 0822582 A2 | 2/1998 |
| EP | 0822584 A2 | 4/1998 |
| EP | 0838839 A2 | 4/1998 |
| EP | 0878824 A2 | 11/1998 |
| EP | 0955668 A2 | 11/1999 |
| EP | 0878824 A3 | 1/2000 |
| JP | 1982/57098679 A | 6/1982 |
| JP | 1983/58130529 A | 8/1983 |
| JP | 1985/60057938 A | 4/1985 |
| JP | 1986/61053732 A | 3/1986 |
| JP | 1986/61134019 A | 6/1986 |
| JP | 1986/61181131 A | 8/1986 |
| JP | 1986/61187238 A | 8/1986 |
| JP | 1986/61270830 A | 12/1986 |
| JP | 1987/62071217 A | 4/1987 |
| JP | 1988/63155713 A | 6/1988 |
| JP | 1989/01208834 A | 8/1989 |
| JP | 1989/10217921 A | 8/1989 |
| JP | 1990/02250323 A | 10/1990 |
| JP | 1991/03012921 A | 1/1991 |
| JP | 1992/04096222 A | 3/1992 |
| JP | 1995/07029823 A | 1/1995 |
| JP | 1997/09251981 A | 9/1997 |
| JP | 1998/10313128 A | 11/1998 |
| JP | 1998/10317169 A | 12/1998 |
| WO | WO-98/05605 | 2/1998 |
| WO | WO-98/13856 | 4/1998 |
| WO | WO-98/32163 | 7/1998 |
| WO | WO-99/01887 | 1/1999 |
| WO | WO-99/03313 | 1/1999 |
| WO | WO-99/49506 | 9/1999 |
| WO | WO-00/52740 | 8/2000 |

OTHER PUBLICATIONS

Glidemeister, J.M., "Xenon Difluoride Etching System" (Nov. 17, 1997).

Habuka et al., "Dominant Overall Chemical Reaction in a Chlorine Trifluoride-Silicon-Nitrogen System at Atmospheric Pressure", Japan Journal of Applied Physics vol. 38 (1999), pp. 6466-6469.

Hecht et al., "A Novel X-ray Photoelectron Spectroscopy Study of the Al/SiO2 Interface", J. App. Phys. vol. 57 (Jun. 15, 1985), pp. 5256-5261.

Houle, F.A., "Dynamics of SiF4 Desorption During Etching of Silicon by XeF2", IBM Almaden Research Center (Apr. 15, 1987), pp. 1866-1872.

Flamm et al., "XeF2 and F-Atom Reactions with Si: Their Significance for Plasma Etching", Solid State Technol. 26, 117 (1983).

Ibbotson et al., "Plasmaless Dry Etching of Silicon with Fluorine-containing Compounds", J. Appl. Phys. vol. 56 No. 10 (Nov. 1984), pp. 2939-2942.

Ibbotson et al., "Comparison of XeF2 and F-atom Reactions with Si and SiO2", Applied Physics Letter, vol. 44, 1129 (1984).

Streller et al., "Selectivity in Dry Etching of Si (100) and XeF2 and VUV Light", Elsevier Science B.V., Applied Surface Science vol. 106 (1996), pp. 341-346.

Winters, H.F., "Etch Products from the Reaction of XeF2 with SiO2, SiO3, Si3N4, SiC, and Si in the Presence of Ion Bombardment", J. Vac. Sci. Technol. B 1(4) (Oct./Dec. 1983), pp. 927-931.

Winters et al., "The Etching of Silicon with XeF2 Vapor", Appl. Phys. Letter, vol. 34(1) (Jan. 1, 1979), pp. 70-73.

XACTIX, Inc., Marketing Brochure (Jun. 27, 1999).

"Xenon Difluoride Isotropic Etch System: Seeing is Believing", Surface Technology Systems Ltd. brochure, Newport, UK (date unknown).

Assorted promotional literature, Surface Technology Systems Ltd., Newport, UK (Jul. 28, 1999).

Kurt Williams, Etch Rates for Micromachining Processing-Part II, 2003 IEEE, pp. 761-778, Journal of Microelectromechanical Systems, vol. 12, No. 6, Dec. 2003.

Anderson, H. M., "Plasma Diagnostics for Semicondcutor Processing", 2000 Digest of the LEOS Topical Meetings (Jul. 24-28, 2000), pp. 117-118 (abstract only).

Baryshev et al., "Monitoring of XiO2/Si Plasma Etching and End-Point Detection". Mikroelektronika (Russia), vol. 25, No. 5 (Sep./Oct. 1996), pp. 373-379 (abstract only).

Bassom et al., "Modeling and Optimizing XeF2-enhanced FIB Milling of Silicon", 25th International Symposium for Testing and Failure Analysis, Santa Clara, CA (Nov. 14-18, 1999), pp. 255-261 (abstract only).

Berg et al., "Real-Time Control of Etching Processes: Experimental Results", Proceedings of the SPIE—The International Society for Optical Engineering, vol. 3213 (1997), pp. 249-260 (abstract only).

Chambers et al., "Endpoint Uniformity Sensing and Analysis in Silicon Dioxide Plasma Etching Using In Situ Mass Spectrometry", J. Vac. Sci. Technol. B, Microelectron. Nanometer Struct., vol. 16, No. 6 (Nov./Dec. 1998), pp. 2996-3002 (abstract only).

Chan et al., "Gas Phase Pulse Etching of Silicon for MEMS with Xenon Difluoride", Engineering Solutions for the Next Millenium: 1999 IEEE Canadian Conference on Electrical and Computer Engineering, Edmonton Alberta, vol. 3 (May 9-12, 1999), pp. 1637-1642 (abstract only).

Chang et al., "Gas-Phase Silicon Micromachining with Silicon Difluoride", Proceedings of the SPIE—The International Socity for Optical Engineering, vol. 2641 (1995), pp. 117-128 (abstract only).

Chen et al., "Spatially Resolved Endpoint Detector for Plasma Etcher", 1997 IEEE International Symposium on Semiconductor Manufacturing Conference Proceedings, San Francisco, CA (Oct. 6-8, 1997), pp. B45-B48 (abstract only).

Chu et al., "Controlled Pulse-Etching with Xenon Difluoride", International Solid State Sensors and Actuators Conference (Transducers '97), Chicago, IL, vol. 1 (Jun. 16-19, 1997), pp. 665-668 (abstract only).

Heinrich et al., "Multichannel Process Monitor for Real-Time Film Thickness and Rate Measurements in Dry Etching and Deposition", Vacuum, vol. 51, No. 4, (Dec. 1998), pp. 497-502 (abstract only).

Kohler et al., "Fabrication of Microlenses by Plasmaless Isotropic Etching Combined with Plastic Moulding", Sens. Actuators A, Phys. (Switzerland), vol. A53, No. 1-3 (May 1996), pp. 361-363 (abstract only).

Li et al., "Mass Spectometric Measurements on Inactively Coupled Fluorocarbon Plasmas: Positive Ions, Radicals and Endpoint Detection", J. Vac. Sci. Technol. A, Vac. Surf. Films, vol. 17, No. 5 (Sept. 1997), pp. 2438-2446 (abstract only).

Liamanond et al, "Production Data Based Optimal Etch Time Control Design for a Reactive Ion Etching Process", IEEE Trans. Semicond. Manuf., vol. 12, No. 1 (Feb. 1999), p. 139-147 (abstract only).

Litvak, H.E., "End Point Control Via Optical Emission Spectroscopy", J.Vac. Sci. Technol. B, Microelectron. Nanometer Struct., vol. 14, No. 1 (Jan./Feb. 1996), pp. 516-520 (abstract only).

Lu et al., "Effluent Monitoring with FTIR Spectroscopy for Low Open Area Oxide Etch Endpoint Detection", 8th International Symposium on Simiconductor Silicon, San Diego, CA, vol. 2 (May 4-8, 1998), pp. 1250-1261 (abstract only).

Maynard et al., "Plasma Etching of Submicron Devices: In Situ Monitoring and Control by Multi-Wavelength Ellipsometry", Thin Solid Films (Switzerland), vol. 313-314, No. 1-2 (Feb. 1998), pp. 398-405 (abstract only).

Melville et al., "Volatile Products and Endpoint Detection in Reactive Ion Etching of III-V Compounds with a Broad Beam ECR Source", Nuclear Instruments & Methods in Physics Research, Section B (Beam Interactions with Materials and Atoms), vol. B106, No. 1-4 (Dec. 1995), pp. 179-182 (abstract only).

Muthukumaran et al., "Gas-Phase Xenon Difluoride Etching of Microsystems Fabricated Through the Mitel 1.5-mu m CMOS Process", Can. J. Electr. Comput. Eng. (Canada), vol. 25, No. 1 (Jan. 2000), pp. 35-41 (abstract only).

Perrin, J., "Mass Spectrometry of Reactive Plasmas", Plasma Processing of Semiconductors. Chateau de Bonas, France (Jun. 17-28, 1996), pp. 397-431 (abstract only).

Richter et al., "Exhaust Gas Monitoring: New Window Into Semiconductor Processing", Solid State Technol., vol. 42, No. 5 (May 1999), pp. 61, 63-64, 68, 70-71 (abstract only).

Saito et al., "Low Temperature Plasmaless Etching of Silicon Dioxide Film Using Chlorine Trifluoride Gas with Water Vapor", J. Electrochem. Soc., vol. 147, No. 12 (Dec. 2000), pp. 4630-4632 (abstract only).

Sebel et al., "Etching of Si Through a Thick Condensed XeF2 Layer", J. Vac. Sci. Technol. A. Vac. Surf. Films, vol. 18, No. 5 (Sep./Oct. 2000), pp. 2090-2097 (abstract only).

Sebel et al., "Reaction Layer Dynamics in Ion-Assisted Si/XeF2 Etching: Temperature Dependence", J. Vac. Sci. Technol. A, Vac. Surf. Films, vol. 18, No. 6, (Nov. 2000), pp. 2759-2769 (abstract only).

Sebel et al., "Silicon Etch Rate Enhancement by Traces of Metal", J. Vac. Sci. Technol. A, Vac. Surf. Films, Vol. 17, No. 3, (May/Jun. 1999), pp. 755-762 (abstract only).

Sugano et al., "Study on XeF2 Pulse Etching Using Wagon Wheel Pattern", Proceedings of the 1999 International Symposium on Micromechantronics and Human Science: Towards the New Century, Nagoya, Japan (Nov. 23-26, 1999), pp. 163-167 (abstract only).

Sun et al., "Sensitive Plasma Etching Endpoint Detection Using Tunable Diode Laser Absorption Spectroscopy", Appl. Phys. Lett., vol. 64, No. 21 (May 23, 1994), pp. 2779-2781 (abstract only).

Thomas et al., "Minimized Response Time of Optical Emission and Mass Spectrometric Signals for Optimized Endpoint Detection", J. Vac. Sci. Technol. B, Microelectron, Nanometer Struct., vol. 14, No. 4 (Jul./Aug. 1996), pp. 2531-2536 (abstract only).

Toda et al., "Thin Beam Bulk Micromachining Based on RIE and Xenon Difluoride Silicon Etching", International Solid State Sensors and Actuators Conference (Transducers '97), Chicago, IL, vol. 1 (Jun. 16-19, 1997), pp. 671-674.

Vugts et al.. "Si/XeF2 Etching: Reaction Layer Dynamics and Surface Roughening", J. Vac. Sci. Technol. A, Vac. Surf, Films, vol. 14, No. 5 (Sep./Oct. 1996), pp. 2780-2789 (abstract only).

Vugts et al., "Si/XeF2 Etching: Temperature Dependence", J. Vac. Sci. Technol. A, Vac. Surf. Films, Vol. 14, No. 5 (Sep./Oct. 1996), pp. 2766-2774 (abstract only).

Wan et al., "Electron Cyclotron Resonance Plasma Reactor for SiO2 Etching: Process Diagnostics, End-Point Detection, and Surface Characterization", J. Vac. Sci. Technol. A, Vac. Surf. Films, vol. 13, No. 4 (Jul./Aug. 1995), pp. 2035-2043 (abstract only).

Wang et al., "Gas-Phase Silicon Etching with Bromine Trifluoride", International Solid State Sensors and Actuators Conference (Transducers '97), Chicago, IL, vol. 2 (Jun. 16-19, 1997), pp. 1505-1508 (abstract only).

Ward, P.P., "Process Control with Optical Emission Spectroscopy", 17th IEEE/CPMT International Electronics Manufacturing Technology Symposium: Manufacturing Technologies—Present and Future, Austin, TX (Oct. 2-4, 1995), pp. 166-169 (abstract only).

Warneke, et al., "In Situ Characterization of CMOS Post-Process Micromachining", Sens. Actuators A, Phys. (Switzerland), vol. A89, No. 1-2 (Mar. 20, 2001), pp. 142-151 (abstract only).

Welch et al., "Breaking the 0.5 Percent Exposed Area Etch Endpoint Barrier", Semicond. Int., vol. 19. No. 8 (Jul. 1996), pp. 269-270, 272, 274, 276 (abstract only).

Wodecki, N.D., Low Open Area Multi-Layered Dielectric Film Etch Endpoint Detction Using EndPoint Plus (TM), Proceedings of the SPIE—The International Society for Optical Engineering, vol. 3882 (1999), pp. 231-238 (abstract only).

Wong et al., "Endpoint prediction for Polysilicon Plasma Etch Via Optical Emission Interferometry", J. Vac. Sci. Technol. A, Vac. Surf, Films, vol. 15, No. 3, Pt. 2 (May/Jun. 1997), pp. 1403-1408 (abstract only).

Yue et al., "Plasma Etching Endpoint Detection Using Multiple Wavelengths for Small Open area Wafers", J. Vac. Sci. Technol. A, Vac. Surf. Films, vol. 19, No. 1 (Jan. 2001), pp. 66-75 (abstract only).

* cited by examiner

METHODS AND APPARATUS OF ETCH PROCESS CONTROL IN FABRICATIONS OF MICROSTRUCTURES

TECHNICAL FIELD OF THE INVENTION

The present invention is related generally to the art of fabrications of microstructures which includes such devices as microelectromechanical systems, semiconductor devices, and, more particularly, to methods and apparatus of controlling etching processes in fabrications of the microstructures.

BACKGROUND OF THE INVENTION

Sacrificial layers of selected sacrificial materials are commonly used in fabrications of microstructures, such as microelectromechanical systems and semiconductor devices. One type of sacrificial material is amorphous silicon. Once the desired structures of the microstructure are formed, the sacrificial layers are removed by etching. The success of the etching process depends upon the selectivity of the etching process, wherein the selectivity is defined as a ratio of the amount of sacrificial material being removed to the amount of the structural material being removed. Performance, uniformity and yield can all be improved with increases in the etch selectivity.

More recently, the etching method using selected gas phase etchants has drawn increased interest in fabricating microstructures due to its many advantages, such as potential high selectivity, less contamination and less process stiction as opposed to other possible etching methods, such as a wet etching techniques. In terms of the different ways of feeding the selected gas etchant into the etch chamber containing the microstructure to be etched, the current etching method has two major categories—continuous etchant feeding and one-time (Batch) etchant feeding. In a typical continuous etchant feeding process, the gas etchant flows through the etch chamber until the sacrificial materials of the microstructure are exhausted by the chemical reaction inside the etch chamber. This etch process is unfavorable because of its poor etchant usage efficiency and other disadvantages. In a typical one time etchant feeding process, the selected gas etchant is introduced into the etch chamber at one time and a chemical reaction occurs between the gas etchant and the sacrificial materials inside the etch chamber. This etch feeding technique improves the etchant usage efficiency and the possibility of precise control of the etching process. However, it also has disadvantages. For example, because the gas etchant and the sacrificial materials and the chemical reaction therebetween are confined in the etch chamber throughout the etching process, the etching product (reaction product) will accumulate within the etch chamber. The accumulation may result in the deposition of the etching products on the surface of the microstructure. In addition, because the amount of the etchant fed into the etching system at one time is fixed and the maximum amount of the sacrificial material that can be removed by the fixed amount of the etchant is limited for a given etching system, the maximum amount of the etchant fed into the etching at one time may not be enough to remove a larger amount of the sacrificial material. One approach to solve the etchant quantity limitation is to feed additional amounts of the etchant into the etching system in a discontinuous fashion. For example, in feeding an additional amount of the etchant, the etching system is pumped out and then provided with the additional amount of the etchant. During the pumping out process, the chemical reaction between the etchant and the sacrificial material, thus the etching process, is stopped until the additional amount of the etchant is provided. This feeding process, however, may cause "etch front marks" and/or etching non-uniformities in the microstructures after etch. For example, when the first amount of the etchant fed at one time into the etching system is not enough to remove all sacrificial materials in the microstructure, the boundaries of the sacrificial material (the etch front) may create "marks" in the structures of the microstructure when the chemical reaction (etching process) is stopped due to the lack of the etchant. These "marks" may be permanent throughout and even after the etching process.

In addition to the disadvantages mentioned above, none of these etching processes addresses the issue of non-uniform etch due to the surface variation of the sacrificial material during etching processes. The etch non-uniformity may arise from etch surface variations, especially in an etching process for a wafer having a plurality of dies, each of which has one or more microstructures. In this situation, the dies around the edge of the wafer and the dies near the center of the wafer experience different etching rates. Moreover, the microloading effect can result in etch rate variation within a single die. Since the selectivity often depends upon the etching rate, unstable etching rate may result in etching non-uniformity to the microstructures. As a consequence, the microstructures in different dies may be etched non-uniformly, which is better illustrated in FIG. 1a and FIG. 1b.

FIG. 1a plots the etching rate and the surface area of the sacrificial materials versus etching time during a typical etching process for a plurality of microstructure dies on a wafer shown in FIG. 1b. During the first 540 seconds, the surface area of the sacrificial materials of all microstructures of the dies deceases slowly with time. Accordingly, the etching rate (plotted in the dotted line) increases to around 22 angstrom/second during the first 160 seconds followed by a slow increase over time thereafter. During the following 160 seconds (from 540 to 700 seconds), the surface area of the sacrificial material presents a steep drop followed by a slow decrease after 700 seconds. Accordingly, the etching rate increases dramatically from 540 to 700 seconds, and increase slowly afterwards. This phenomenon of steep decrease in the surface area and dramatic increase in the etching rate arises from a fact that, during the 240 seconds (from 540 to 780 seconds), the sacrificial material of the dies (plotted in shaded areas in FIG. 1b) around the edge of the wafer is removed due to less sacrificial materials in these dies than those close to the center of the wafer. Because the etch rate is proportional to the concentration of the etchant gas, the rest of the sacrificial materials will experience a much faster etch rate. This etching rate difference may cause unexpected performance differences of the microstructures of the dies around the edge of the wafer and the microstructures of the dies close to the center of the wafer.

Therefore, a method and apparatus is desired for efficiently and uniformly removing sacrificial layers in microstructures using selected gas phase etchant.

SUMMARY OF THE INVENTION

In view of the forgoing, the present invention teaches a method for removing the sacrificial materials in fabrications of microstructures using one or more selected spontaneous vapor phase etchants. A spontaneous chemical etchant is an etchant such that a chemical reaction between said etchant and a sacrificial material occurs spontaneously and does not require activation energy. A spontaneous vapor phase etchant is a chemical etchant that spontaneously reacts with the sacrificial material in vapor phase. In particular, the present invention provides a method for controlling the etching rate during the etching process by feeding the etchant based on a detection of an amount of the etchant or an etch product.

In an embodiment of the invention, a method is disclosed. The method comprises: loading a microstructure into an etch chamber of the etch system, wherein the microstructure comprises a sacrificial material and one or more structural materials; providing an amount of a spontaneous vapor phase etchant recipe to the etch system; and providing an additional amount of the etchant recipe to the etch system at a time that is determined based on a measurement of an amount of a chemical species.

In another embodiment of the invention, a method is disclosed. The method comprises: loading a microstructure into an etch chamber of an etching system; and providing an etchant recipe to the etch chamber over time, wherein an amount of the etchant recipe per time unit varies.

In yet another embodiment of the invention, a method for etching a microstructure in an etch chamber is disclosed. The method comprises: providing an etchant recipe to the etch chamber over time, wherein an amount of the etchant is varied when a change of a measured parameter beyond a predetermined value.

In yet another embodiment of the invention, a method of etching a plurality of microstructures in an etch chamber is disclosed. The method comprises: collecting data of a parameter during a first etching process for a first microstructure using an etchant recipe; determining a variation profile of the parameter in the first etch process; and etching a second microstructure in a second etching process using the etchant recipe based on the collected data of the parameter in the first etching process.

In yet another embodiment of the invention, a method of etching a plurality of microstructures in a plurality of etching processes is disclosed. The method comprises: collecting a plurality of data of a parameter that characterizes an etching process using an etchant recipe; storing the collected data; and etching a microstructure using the etchant recipe based on the collected data of the parameter.

In yet another embodiment of the invention, a method is disclosed. The method comprises: loading a microstructure into an etch chamber of an etching system, wherein the microstructure comprises a sacrificial material and one or more structural materials; and etching the sacrificial material using a spontaneous vapor phase etchant recipe under a pressure of 1 atmosphere or higher.

In yet another embodiment of the invention, an etching system is disclosed. The etching system comprises: an etch chamber containing a microstructure, wherein the microstructure has one or more structural materials and a sacrificial material to be removed by a spontaneous vapor phase etchant recipe, the etch chamber further comprising: an agitator for agitating the etchant recipe gas within the etch chamber; a pump connected to the etch chamber for pumping out the etchant recipe gas out of the etch chamber; an exchange chamber attached to the etch chamber via an exchange chamber gate; and an etchant gas source containing a spontaneous vapor phase etchant of the etchant recipe.

BRIEF DESCRIPTION OF DRAWINGS

While the appended claims set forth the features of the present invention with particularity, the invention, together with its objects and advantages, may be best understood from the following detailed description taken in conjunction with the accompanying drawings of which:

DETAILED DESCRIPTION OF THE EMBODIMENTS

The present invention teaches a method for removing sacrificial materials in fabrications of microstructures using one or more selected spontaneous vapor phase etchants. During the etching process, the etching rate is controlled by feeding the etchant based on a detection of an amount of the etchant or an amount of etching product.

Figure 2:
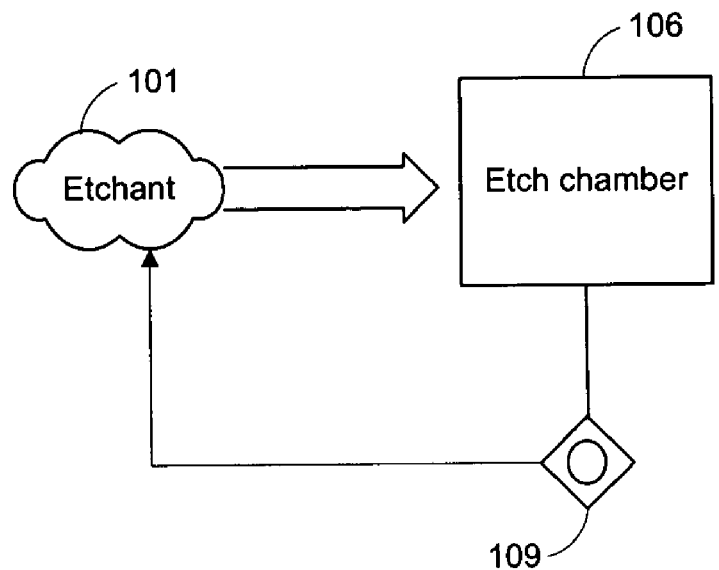
FIG. 2 schematically illustrates a method of feeding spontaneous vapor phase etchant into an etch chamber containing a microstructure according to the invention.

Referring to FIG. 2, etching chamber 106 and detector 109 are part of an etching system of the present invention. The detector is preferably connected downstream of the etch chamber and dynamically measures the concentration of a chemical species, such as the etchant or an etch product, flowing out of the etch chamber. The measured concentration is analyzed to obtain the etching process information, such as the etching rate (defined as the amount of the sacrificial material being removed per second) and/or etching product generation rate (defined as the amount of the etching product generated through the chemical reaction between the etchant and the sacrificial material per second) inside the etch chamber, which will be discussed in detail afterwards. In an embodiment of the invention, the detector is a MKS Process Sense that uses Infra-Red light to dynamically measure the concentration of an etch product. Other types of detectors, such as a Residual Gas Analyzer from AMETEK may also be used. Rather than detecting and analyzing the concentration of the etchant or the etch product so as to obtain the etching process information inside the etch chamber, other parameters, such as pressure inside the etching chamber may be measured and analyzed to obtain similar etching process information.

The analyzed result from the detection result is then used to dynamically control the amount of the selected spontaneous vapor phase etchant fed into the etch chamber and the feeding time of the etchant and/or the time interval between two consecutive etchant feedings.

As a way of example, a first amount of the selected etchant is fed into the etch chamber at the beginning of an etching process. The etchant chemically reacts with the sacrificial material within the etch chamber. The detector dynamically measures the concentration of the etchant or an etch product flowing out the etch chamber. Based on the measured concentration, etch rate that is proportional to the derivative of the concentration over time is calculated and compared with a predetermined value. When the etch rate is lower than the predefined value, a second amount of the selected etchant is then fed into the etch chamber. The value of the second amount can be determined in many ways. In an embodiment of the invention, the value of the second amount of the etchant is proportional to the remaining sacrificial material surface area, which can be calculated from a measured etchant feeding rate and etching product concentration. In this way, the etching rate can be maintained at a substantially constant value. This feeding process continues until the sacrificial material inside the etch chamber is removed.

Figure 3:
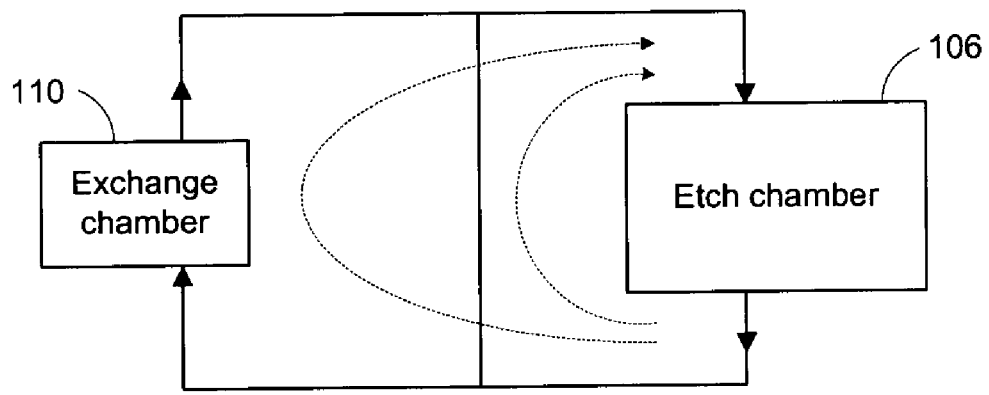
FIG. 3 schematically illustrates two separate circulation loops through which the selected spontaneous vapor phase etchant is circulated.

According to an embodiment of the invention, the etchant is fed into the etch chamber via an outer circulation loop that passes through the etch chamber and an exchange chamber in which the etchant is prepared, as shown in FIG. 3. When the selected etchant is prepared and to be fed into the etch chamber, the second loop is opened and the prepared etchant is fed into the etch chamber. This is accomplished by a plurality of valves connected to the circulation loops, which will be discussed in detail afterwards. In addition to feeding the etchant into the etch chamber, the second loop is also used for venting the chemical reaction products out of the etch chamber. Specifically, a pump is connected to the second loop and pumps the reaction products outside the etching system. In an embodiment of the invention, the pump is connected to the exchange chamber and pumps the reaction products outside the etching system.

After the prepared etchant is fed into the etch chamber, the second loop is closed and the circulation of the etchant is switched from the second loop to the first loop that passes through the etch chamber but not the exchange chamber. This switch from the second loop into the first loop is accomplished by a plurality of valves connected to the inner and second loop. As the etchant flows through the etch chamber via either loop, it chemically reacts with the sacrificial material of the microstructure inside the etch chamber, which generates one or more reaction products also in gas phase. Because the etchant is flowing through the etch chamber, the chemical reaction rate is faster and more uniform than that when the etchant is not flowing. After rounds of circulations via the first loop, the concentration of the etchant is decreased and the concentrations of the chemical reaction products are increased due to the chemical reaction between the etchant and the sacrificial material within the etch chamber. The increase of the concentrations of the etch products or the decrease of the concentration of the etchant is then measured and analyzed. The analyzed result is then used to determine whether to initiate the feeding of additional etchant into the etch chamber. If the analyzed result determines that an additional amount of etchant needs to be fed into the etch chamber, the amount of the additional etchant is determined concurrently. Then the second loop is closed. At least a portion of the reaction products is vented out from the exchange chamber. The additional etchant of the determined amount based on the analyzed result is prepared in the exchange chamber. The prepared additional etchant is fed into the etch chamber from the exchange chamber.

The circulation via the first loop and the second loop continues until the sacrificial materials of the microstructure inside the etch chamber are substantially removed.

In the following, the present invention will be discussed with references to embodiments in which spontaneous vapor phase $XeF_2$ is used as the selected etchant for etching amorphous silicon of a micromirror device. It will be appreciated by those skilled in the art that the following discussion is for demonstration purposes only, and it should not be interpreted in any ways as a limitation to the present invention. Instead, other variations to the following embodiments without departing from the spirit of the present invention may be employed. For example, the selected etchant can be other spontaneous vapor phase noble gas halide in addition to $XeF_2$ or spontaneous vapor phase interhalogen, such as bromine trichloride, or other proper chemical species, such as HF for removing amorphous (or porous) silicon or other sacrificial materials, such as tungsten, titanium or silicon oxide.

Etching Chemistry and Theoretical Analysis

A list of symbols used in the following discussion

| | A list of symbols used in the following discussion |
|---|---|
| $r_m$ | Mass etching rate, mole/sec |
| $r_h$ | Thickness etching rate, angstrom/sec |
| $n_{SiF_4}$ | $SiF_4$ amount in mole, mole |
| $n_{XeF_2}$ | $XeF_2$ amount in mole, mole |
| $C_{SiF_4}$ | molar concentration of $SiF_4$, mole/liter |
| $C_{SiF_4}^0$ | molar initial concentration of $SiF_4$, mole/liter |
| $C_{XeF_2}$ | molar concentration of $XeF_2$ at time t inside the etch chamber, mole/liter |
| $C_{XeF_2}^0$ | molar concentration of $XeF_2$ in the etchant recipe being fed into the etch chamber, mole/liter |
| t | Time, sec |
| $V_{etch}$ | Volume of the etching chamber, liter |
| $A_{Si}$ | Area of the sacrificial material, $cm^2$ |
| $k_m$ | Mass etching rate constant, cm/sec |
| $k_h$ | Thickness etching rate constant, angstrom/(sec · torr) |
| $\rho_{Si}$ | Mass density of the sacrificial material, $g/cm^3$ |
| $M_{Si}$ | Mass molar weight of the sacrificial material, g/mole |
| h | Thickness of the sacrificial material, angstrom |
| Q | Etchant recipe feeding rate, defined as the volume of the exchange chamber divided by the feeding cycle time, liter/sec |
| $P_{XeF_2}$ | Pressure of $XeF_2$ in the etch chamber at time t, torr |
| $P_{XeF_2}^0$ | Pressure of $XeF_2$ being fed into the exchange chamber, torr |

The etching mechanism of $XeF_2$ with amorphous silicon is can be expressed as:

$$2XeF_2(gas) + Si(gas) = 2Xe(gas) + SiF_4(gas) \qquad \text{Equation 1}$$

Xe and $SiF_4$ are volatile etching products. Assuming the etching process is chemical reaction limited and the $XeF_2$ concentration is uniform in the etch chamber, the molar etching rate, $r_m$, and the thickness etching rate, $r_h$, can be defined as:

$$r_m = \frac{dn_{SiF_4}}{dt} = V_{etch}\frac{dC_{SiF_4}}{dt} = -2\frac{dn_{XeF_2}}{dt} = k_m A_{Si} C_{XeF_2} \qquad \text{Equation 2}$$

And the thickness etching rate $r_h$ is defined as:

$$r_h = \frac{dh}{dt} = k_h P_{XeF_2} \qquad \text{Equation 3}$$

wherein h is the thickness of the sacrificial material. And the relation between $r_m$ and $r_h$ can be expressed as:

$$r_m = \frac{dn_{SiF_4}}{dt} = \frac{A_{Si}\rho_{Si}}{M_{Si}}\frac{dh}{dt} = \gamma A_{Si} r_h \quad \text{Equation 4}$$

Based on the definitions of the etching rates $r_h$ and $r_m$ in equations 2 and 3, the mass balance equation of $SiF_4$ is:

$$V_{etch}\frac{dC_{SiF_4}}{dt} = -QC_{SiF_4} + r_m = -QC_{SiF_4} + \gamma A_{Si} r_h \quad \text{Equation 5a}$$

and the etching rates can be expressed in terms of the etching product $SiF_4$ as $$r_h = \frac{1}{\gamma A_{Si}}\left(V_{etch}\frac{dC_{SiF_4}}{dt} + QC_{SiF_4}\right) \quad \text{Equation 5b}$$

By plugging $C_{SiF4}$ that is measured by the detector, etch rate $r_h$ can thus be obtained from the above equation. The etching rate can also be expressed in terms of the $XeF_2$ from the mass balance of $XeF_2$:

$$\frac{dn_{XeF_2}}{dt} = Q(C^0_{XeF_2} - C_{XeF_2}) - 2r_m \quad \text{Equation 6}$$

$$\frac{dP_{XeF_2}}{dt} = \frac{Q}{V_{etch}}(P^0_{XeF_2} - P_{XeF_2}) - 2\frac{k_m A_{Si}}{V_{etch}}P_{XeF_2}$$

The time dependence of the $XeF_2$ pressure inside the etch chamber can be derived from equation 6.

$$P_{XeF_2} = \frac{Q}{Q+2k_m A_{Si}}\left(1-\exp\left(-\frac{Q+2k_m A_{Si}}{V_{etch}}t\right)\right)P^0_{XeF_2} \quad \text{Equation 7}$$

From equation 6, it can be deducted that the pressure of $XeF_2$ inside the etch chamber after enough long time is:

$$P^\infty_{XeF_2} = \frac{Q}{Q+2k_m A_{Si}} P^0_{XeF_2} \quad \text{Equation 8}$$

Therefore, the equilibrium etching rate can be calculated as:

$$r_h = k_h P^\infty_{XeF2} = \frac{K_h Q}{Q+2k_m A_{Si}}P^0_{XeF_2} = \quad \text{Equation 9}$$
$$\frac{k_h Q}{Q+2\gamma RT k_h A_{Si}}P^0_{XeF_2} = \frac{k_h Q}{Q+\kappa k_h A_{Si}}P^0_{XeF_2}$$

wherein κ is a constant defined as:

$$\kappa = 2\gamma RT = \frac{2RTA_{Si}\rho_{Si}}{M_{Si}} = 0.030868$$

By combining equations 5b and 9, the time dependence of the surface area of the sacrificial material amorphous silicon can be derived, and expressed as following:

$$r_h = \frac{1}{\gamma A_{Si}}\left(V_{etch}\frac{dC_{SiF_4}}{dt} + QC_{SiF_4}\right) = \frac{k_h Q}{Q+\kappa k_h A_{Si}}P^0_{XeF_2} \text{ and} \quad \text{Equation 10a}$$

$$A_{Si} = \frac{1}{\dfrac{\gamma k_h P^0_{XeF_2}}{\left(V_{etch}\dfrac{dC_{SiF_4}}{dt}+QC_{SiF_4}\right)} - \dfrac{\kappa k_h}{Q}} \quad \text{Equation 10b}$$

In order to obtain a constant etching rate, pressure $P_{XeF2}^0$ of $XeF_2$ that is fed into the etch chamber, or the etchant recipe feeding rate Q can be adjusted according to equation 11 and equation 12, which are derived from equation 8.

$$P^0_{XeF_2} = \frac{(Q+2k_m A_{Si})}{Q}P_{XeF_2} = \frac{(Q+2k_m A_{Si})}{Q}\frac{r^0_h}{k_h} \quad \text{Equation 11}$$

$$Q = \frac{2k_m A_{Si} P_{XeF_2}}{P^0_{XeF} - P_{XeF}} = \frac{2k_m A_{Si} P_{XeF_2} r^0_h}{k_h P^0_{XeF_2} - r_h} \quad \text{Equation 12}$$

$k_h$ can be calculated by equation 10 at the beginning of the etching process when the surface area of the sacrificial material is still a constant. Alternatively, $k_h$ can be calibrated from a blank amorphous silicon wafer. Therefore, the surface area of the sacrificial material $A_{Si}$ can be calculated from equation 10b and can be used to control the etchant feeding, such as the amount of the additional etchant fed into the etch chamber so as to obtain a substantially constant etching rate, which will be discussed in detail in the following.

Etching Rate Control Scheme

In an etching process, a first amount of spontaneous vapor phase $XeF_2$ that is preferably mixed with a diluent gas is fed into the etch chamber and starts the chemical reaction with the amorphous silicon. After a time period (e.g. around 100 seconds), the $XeF_2$ gas reaches equilibrium. The detector, such as the MKS Process Sense, measures the concentration, $C_{SiF4}$, of the etching product $SiF_4$ as a function of time. The derivative, ($dC_{SiF4}/dt$) is calculated from the measured concentration $C_{SiF4}$. The measured $C_{SiF4}$ and the calculated ($dC_{SiF4}/dt$), as well as other known parameters γ, $A_{Si}^0$ (the initial area of amorphous silicon), $V_{etch}$, and Q, are fed into equation 5b for calculating the initial etching rate $r_h^0$. As the $XeF_2$ reacts with the amorphous silicon, the concentration of $XeF_2$ decreases, while the concentration of $SiF_4$ increases. The detector dynamically measures the concentration, $C_{SiF4}$, of the etching product $SiF_4$ as a function of time. The derivative, ($dC_{SiF4}/dt$) is calculated in real-time from the measured concentration $C_{SiF4}$ by, for example, a data processing unit. Both $C_{SiF4}$ and ($dC_{SiF4}/dt$) are then feed into equation 10b for calculating the surface area $A_{Si}$ at time t of the amorphous silicon. During the etching process, the surface area $A_{Si}$ changes over time, resulting in the variation of the etch rate over time. In order to maintain a constant etch rate, additional amounts of the etchant are fed into the etch chamber. The additional amount of $XeF_2$ can be determined by equation 11 and achieved accordingly by adjusting the $XeF_2$ pressure inside the exchange chamber. Alternatively, the additional amount can be determined according to equation 12 and achieved by adjusting the recipe feeding rate Q.

Figure 4:
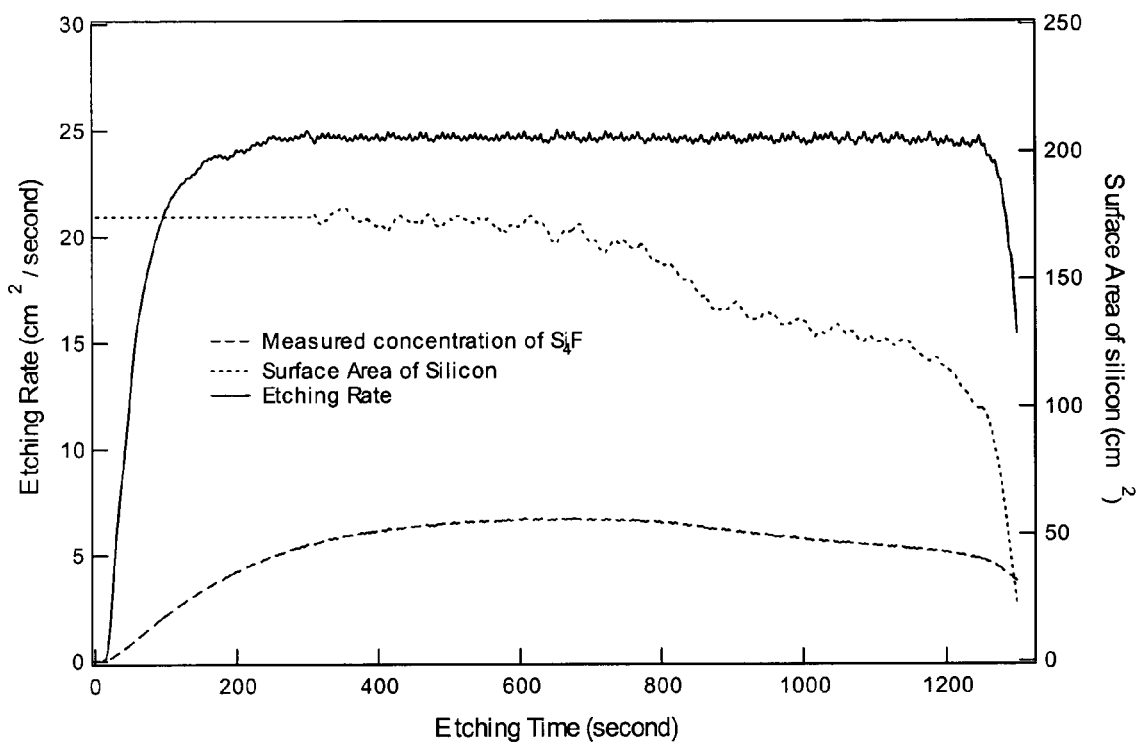
FIG. 4 plots the etching rate, the concentration of a measured etching product and the surface area of the sacrificial material versus the etching time in an etching process according to an embodiment of the invention.

FIG. 4 plots the surface area, the etching rate versus the etching time in an etching process according to the embodiment of the invention. Referring to FIG. 4, the continuous line represents the etching rate. The dotted line represents the surface area of the amorphous silicon inside the etch chamber. The dashed line represents the measured concentration of the etching product $SiF_4$ detected by the detector.

Figure 1A:
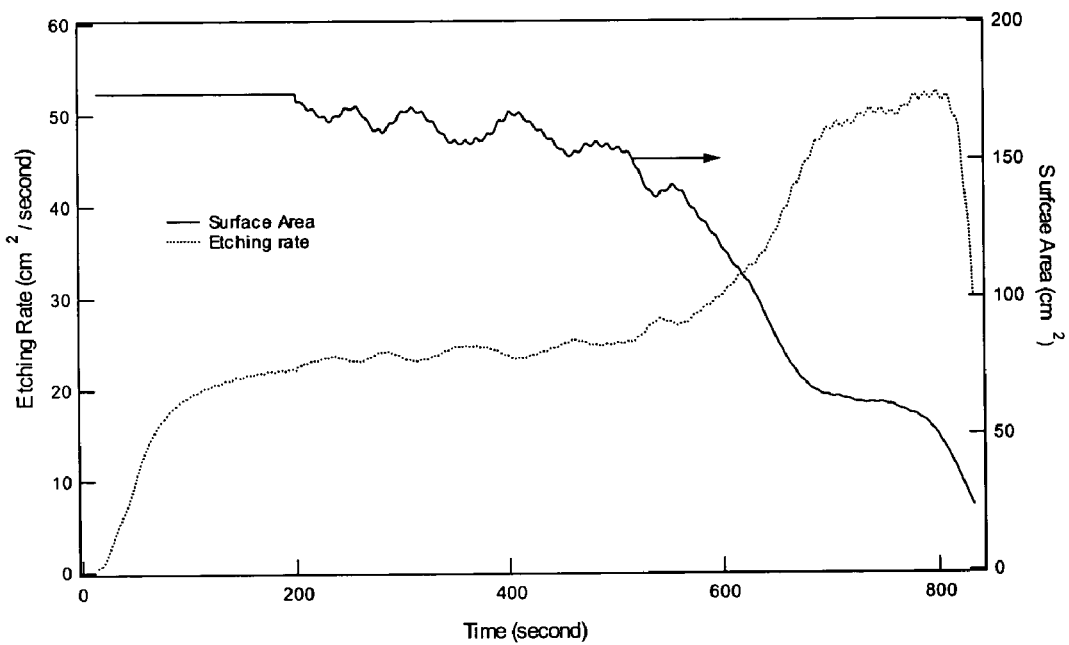
FIG. 1a plots the etching rate and the calculated surface area of the sacrificial material versus the etching time in an exemplary etching process.
Figure 1B:
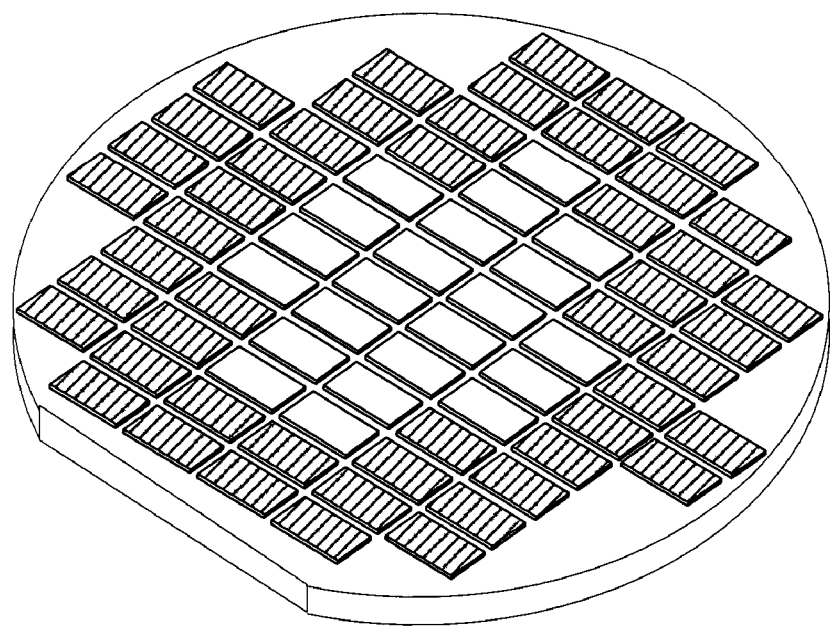
FIG. 1b illustrates a plurality of microstructure dies, each having one or more microstructures, on a wafer.

During the first 100 seconds, the etching rate $r_h$ climbs from zero to its initial etching rate around 25 angstrom/second corresponding to a steady state of $XeF_2$ inside the etch chamber. During this time period, the surface area does not show a measurable change. The concentration of the etching product $SiF_4$ increases slowly. During the following 700 seconds (from 100 to 800 seconds in the plot), the etching rate, the surface area of the amorphous silicon and the detected concentration of $SiF_4$ do not change substantially. During the time period around 100 seconds (from 800 to 900 seconds) after 800 seconds of etching process, the surface area of amorphous silicon presents a steep drop. This phenomenon arises from the fact that the sacrificial material of the dies around the edge of the wafer is removed, and the sacrificial material of the dies near the center of the wafer starts to be removed, as shown in FIG. 1b. The variation of the surface area is analyzed from the concentrations of $SiF_4$ measured by the detector. Additional amounts of the spontaneous vapor phase $XeF_2$ having adjusted pressures are fed into the etch chamber so as to maintain a constant etch rate, as shown in the figure.

This etchant feeding process continues until the sacrificial material is removed. The removal of the sacrificial material can be indicated by many parameters. For example, when the etch rate is below a predetermined value, such as 1% of the initial etch rate or the surface area is below a predetermined value such as 1% of the initial surface area or the measured concentration of $SiF_4$ is below a predefined value, such as less than 1% of its initial value, the sacrificial material inside the etch chamber is removed.

According to the invention, the spontaneous vapor phase etchant is fed into the etch chamber via an second loop. After the etchant feeding, the etchant is circulated via an first loop or an second loop that passes through the etch chamber for removing the sacrificial material. An exemplary etching system having the first loop and the second loop is illustrated in FIG. 5.

Figure 5:
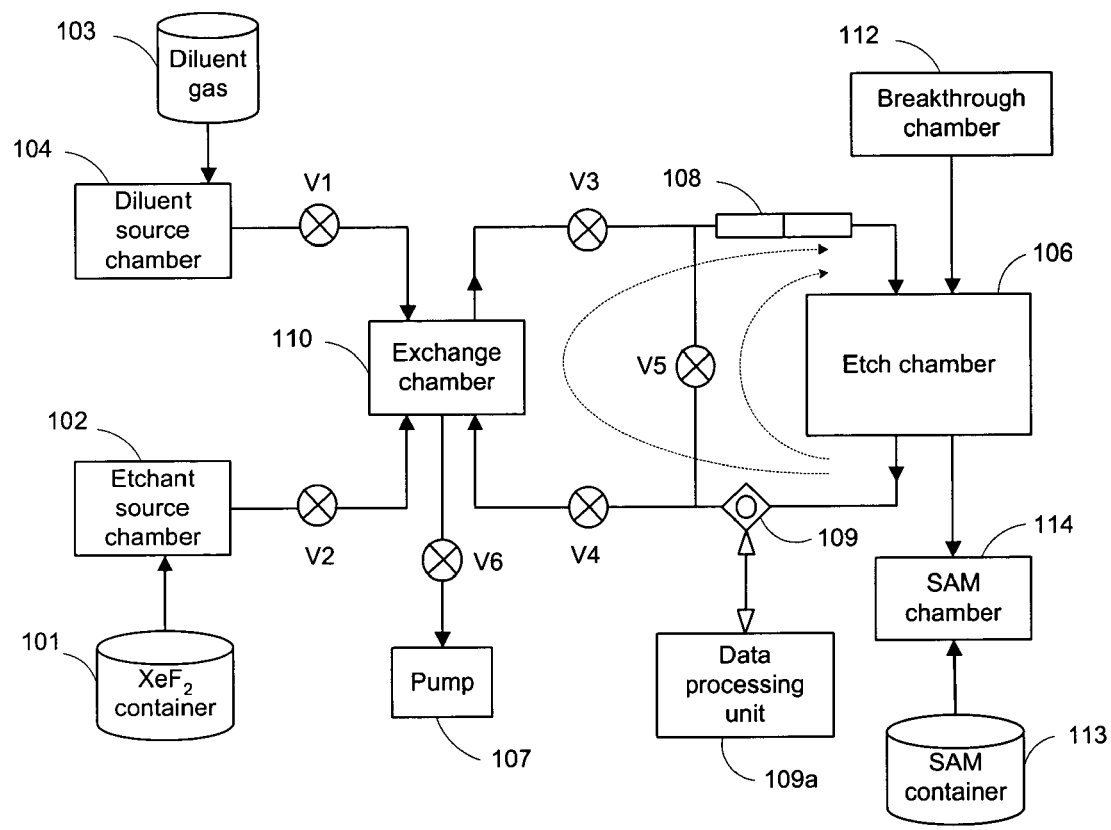
FIG. 5 is a block diagram illustrating an etching system of the present invention.

Referring to FIG. 5, the etching system comprises etch chamber 106 and exchange chamber 110. The etch chamber contains the microstructure (e.g. micromirror) having amorphous silicon to be removed. The spontaneous vapor phase $XeF_2$ and one or more diluent gases are mixed in the exchange chamber. In the embodiment of the invention, the diluent gas is preferably an inert gas, such as nitrogen, helium, argon, krypton, neon or xenon or a mixture of one or more inert gases, and more preferably nitrogen gas or helium gas. The cubic volume of the exchange chamber is preferably much less than (e.g. around one twentieth of or one fiftieth of) the cubic volume of the etch chamber such that the amount of the mixed gas of $XeF_2$ and the diluent gas is smaller than the mixed gas (including the etchant, the diluent gas and the etching products) in the etch chamber. As a result, the feeding of the mixed gas into the etch chamber during one feeding cycle does not dramatically change the etching process, such as the etching rate inside the etch chamber.

The exchange chamber, the etch chamber and valve V3, circulation pump 108, valve V4 and detector 109 form the outer circulation loop illustrated as a dotted line. The etch chamber, circulation pump 108, valve V5 and detector form the inner circulation loop as illustrated in another dotted line.

The arrows in the figure represent the flow direction of the mixed gases within the etching system. Of course, the flow directions can be reversed, as long as all flow directions within each segment of the flow path are reversed. The circulation pump 108 continuously or semi-continuously pumps the gases so as to maintain the circulation via the two loops. Alternatively, two pumps, one in each circulation loop, could be provided. The detector dynamically measures the concentration of a reaction product such as $SiF_4$ gas. The measured concentration is then analyzed by the processing unit to obtain the progress information on the etching process inside the etch chamber. In the embodiment of the invention, the detector is a MKS Process Sense that uses Infra-Red light to detect the reaction products. Other detectors, such as a Residual Gas Analyzer from AMETEK may also be employed. The detector is connected to data processing unit 109a, which performs calculations relevant to the equations 1 through 10b. Rather than the data processing unit, the embodiments of the present invention may also be implemented in a microprocessor-based programmable unit, and the like, using instructions, such as program modules, that are executed by a processor. Generally, program modules include routines, objects, components, data structures and the like that perform particular tasks or implement particular abstract data types. The term "program" includes one or more program modules. When the embodiments of the present invention are implemented in such a unit, it is preferred that the unit communicates with the detector and takes corresponding actions based upon the measured data, such as adjusting the concentrations of the selected chemical species.

Valves V3, V4 and V5 switch the circulation via the inner circulation loop and the outer circulation loop. Specifically, the outer circulation is activated by opening (e.g. allowing the gas to flow through) the valves V3 and V4, and closing (e.g. blocking the gas to flow through) valve V5. The inner circulation loop is activated by opening valve V5 and closing valves V3 and V4.

The exchange chamber is further connected to diluent source chamber 104 via valve V1, and the diluent source chamber is connected to diluent gas cylinder 103. In the embodiment of the invention, helium is preferably used as the diluent gas and contained in the diluent gas cylinder. Of course, other suitable gases, such as inert gas (e.g. nitrogen, Ar, Kr and Xe) may also be used as the diluent gas. In addition to the diluent source chamber, the exchange chamber is also connected to etchant source chamber 102 via valve V2 and pump 107 via valve V6. The etchant source chamber is further connected to the etchant gas container, such as $XeF_2$ container 101.

In the etching process, $XeF_2$ gas is fed into the etch chamber and chemically reacts with the amorphous silicon. In order to expedite the chemical reaction and enhance the efficiency of the chemical reaction especially between $XeF_2$ and amorphous silicon underneath the functional structures (e.g. the micromirrors of the micromirror devices) of the microstructures, the partial pressure of $XeF_2$ gas is preferably from 0 to 15 torr. The $XeF_2$ gas is mixed with a diluent gas, such as helium, having a partial pressure preferably from 20 to 700 torr, more preferably from 50 to 100 torr and more preferably around 100 torr. The total pressure of the mixed gas is preferably from 20 to 700 torr. Alternatively, the total pressure can be 1 atmosphere or higher. The ratio of the etchant (e.g. $XeF_2$) partial pressure to the diluent gas partial pressure of the mixed gas is preferably from 1/1000 to 1/10, more preferably from 1/10 to 1/700, and more preferably from 6/100 to 4/200. The mixed gas is then fed into the etch chamber. The temperature of the gases (including $XeF_2$, Xe, and $SiF_4$) inside the etch chamber is preferably around 25° degrees. Because the chemical reaction releases heat, which is localized in narrow regions in the vicinity of the sacrificial layers having amorphous silicon, these regions may have a higher temperature than the gases inside the etch chamber. Within the etch chamber, the mean-free-path of the etchant gas is preferably less than 2 micrometers, more preferably less than 0.5 micrometer. The mean-free-path is defined as the average distance that a molecular travels before it collides with another.

The spontaneous vapor phase $XeF_2$ is contained in $XeF_2$ container 101 that contains both solid phase $XeF_2$ and vapor phase $XeF_2$. The temperature of the $XeF_2$ container is preferably around 25° degrees and the pressure is preferably from 0 to 15 torr, and more preferably around 4 torr. The $XeF_2$ container is connected to etchant source chamber 102 that contains vapor phase $XeF_2$ only. In an alternative embodiment of the invention, $XeF_2$ container 101 is not provided and the solid phase $XeF_2$ is directly disposed inside etchant source chamber 102. At room temperature, a portion of the solid phase $XeF_2$ sublimates into vapor phase $XeF_2$ at a pressure around 4 torr inside the etchant source chamber.

In the following, an exemplary etching process will be discussed with reference to FIG. 6, which illustrates steps executed in the exemplary etching process. For simplicity and demonstration purposes without losing the generality, the following discussion assumes that helium gas is used as the vapor phase diluent.

Figure 6:
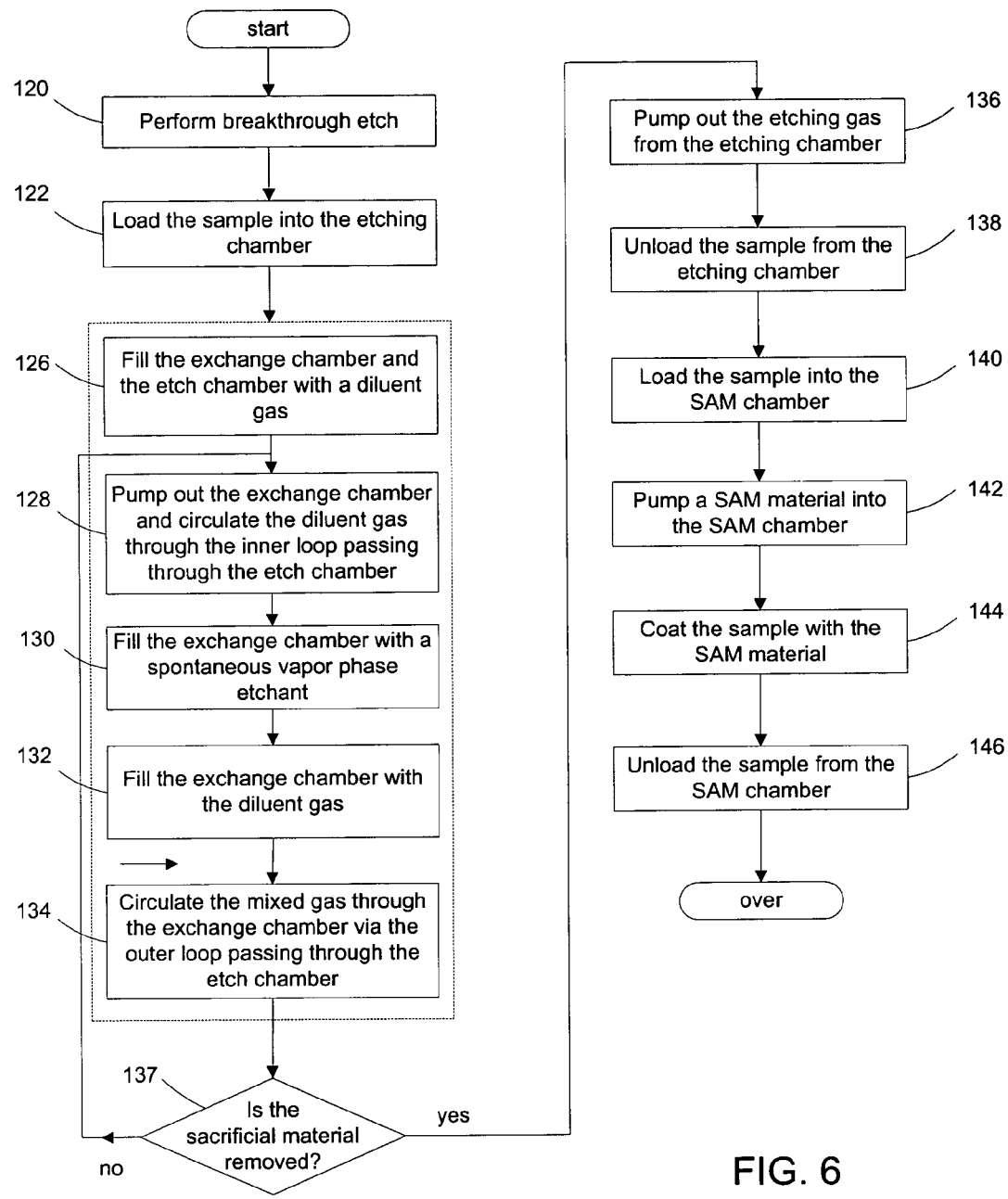
FIG. 6 is flow chart illustrating steps executed for etching samples using the etching system in FIG. 5.

Referring to FIG. 6, the etching process begins with filling the exchange chamber and the etch chamber with the helium gas (step 126) that has a pressure preferably from 20 to 700 torr (steps 120 and 122 are optional and will be discussed afterwards). This filling step is achieved by opening valves V1, V3, V4, V5 and closing valves V2 and V6 for a time period, preferably around 500 milliseconds until the diluent gas inside the etching system reaches equilibrium. At step 128, the exchange chamber is pumped out so as to reduce the pressure inside exchange chamber and meanwhile, circulating the diluent gas through the first loop for a time period preferably from 100 to 1500 milliseconds. This step is accomplished by opening valve V5 and valve V6 and closing valves V1, V2, V3 and V4. As a result, the pressure inside the exchange chamber is reduced to a pressure from 0 to 15 torr, while the pressure inside etch chamber 106 is maintained at a pressure from 20 to 700 torr. Because the pressure of the exchange chamber is equal to or below the pressure of $XeF_2$ inside etchant source chamber 102, $XeF_2$ can thus flow into the exchange chamber, which is conducted at step 130 by opening valve V2 and closing valves V1, V3, V4 and V6. At this step, valve V5 is left open—allowing the diluent gas to keep on circulating via the inner circulation loop. During this step, a first amount of $XeF_2$ flows into the exchange chamber. The amount may be controlled by the duration of opening valve V2. Alternatively the amount can be controlled through controlling the duration of the opening of valve V6. For example, by controlling the open duration of valve V6, the pressure of the gas left inside the exchange chamber can be set to a desired pressure value, such as 1 torr, 2 torr and 3 torr, wherein the desired pressure corresponds to the desired additional amount of $XeF_2$ to be filled into the exchange chamber. For example, when the pressure of the gas inside the exchange chamber is set to 1 torr, an additional amount of $XeF_2$ corresponding to 3 torr (3 torr=4 torr–1 torr) is fed into the exchange chamber when valve V2 is opened. In the embodiment of the invention, the duration of opening valve V2 is preferably around 500 milliseconds. The helium diluent gas mixes with the $XeF_2$ etchant gas and reaches equilibrium. This step is accomplished by opening valve V1 and closing valves V2, V3, V4 and V6 for a time duration preferably around 100 milliseconds. After the $XeF_2$ gas is mixed with the helium gas, the mixed gas is then fed into etch chamber 106 at step 134. This feeding step is accomplished by opening valve V3 and valve V4 and closing the rest of the valves, including valves V1, V2, V5, and V6. It can be seen that, by closing valve V5 and opening valves V3 and V4, the inner circulation loop is closed and the outer circulation loop is opened. As a result, the mixed gas flows via the outer circulation loop and passes through the etch chamber for etching the amorphous silicon through the chemical reaction inside the etch chamber. This step may last for a time period, preferably from 1000 to 3000 milliseconds, depending upon the measurement result of the detector 109.

The detector dynamically measures the concentration $C_{SiF4}$ of the etching product $SiF_4$ using Infra-Red light. The derivative $(dC_{SiF4}/dt)$ is calculated in real-time by the data processing unit. These measured parameters are plugged into equation 10b for calculating the surface area $A_{Si}(t)$ of the amorphous silicon so as to determine whether the surface area changes (step 135). If the surface area changes, the $XeF_2$ pressure $P_{XeF2}^0$ being fed into the etch chamber is adjusted to maintain a constant pressure of $XeF_2$ inside the etching chamber $P_{XeF2}(t)$ according to equation 11. Because the partial pressure of $XeF_2$ inside the etch chamber is maintained at a constant value, the etch rate is maintained at a constant value according to equation 3. The etching process loops back to step 128, in which a second amount of the spontaneous vapor phase $XeF_2$ having the adjusted pressure $P_{XeF2}^0$ is prepared in the exchange chamber and then fed into the etch chamber so as to keep the etching rate $r_h$ substantially the same as the initial etching rate, $r_h^0$.

If the calculated surface area is less than a predetermined value, such as 1% of the initial surface area before etching, it is believed that the sacrificial material inside the etch chamber is substantially removed. This determination can also be made based on the detection of the concentration of $SiF_4$ or the calculated etching rate (preferably the change of the etch rate) according to the measured concentration of $SiF_4$. Specifically, when the measured concentration of $SiF_4$ is lower than a predefined value, such as 1% of its initial concentration, it is believed that the sacrificial material inside the etch chamber is totally removed. Alternatively, the current etching rate is calculated based on the measured concentration of $SiF_4$, and compared with a predefined etching rate value, such as 1% of its initial etching rate. When the calculated current etching rate is less than the predefined etching rate, it is believed than the sacrificial material inside the etch chamber is removed.

If step 137 determines that the sacrificial material inside the etch chamber is not thoroughly removed, the etching process loops back to step 134. Otherwise, the etching process is stopped.

The etchant is fed into the etch chamber and circulated via the outer circulation loop or the inner circulation loop. Before an etch feeding, a portion of the mixed gas including the etchant, the diluent gas and the etching products is pumped out through the exchange chamber from the etching system. According to the invention, the pumping out rate, which is defined as the amount of the mixed gas pumped out from the etching system per unit time, is preferably 2 liters per minute or less. The circulation rate, which is defined as the amount of the mixed gas flowing through the etch chamber per unit time is preferably 1/20 liter-per-second or more, more preferably 1/10 liter-per-second or more, more preferably 1/2 liter-per-second or more, more preferably 1 liter-per-second or more.

In the embodiment discussed above, the detector measures the amount of an etching product, such as $SiF_4$. Alternatively, the detector can dynamically measure the concentration of the etchant, such as $XeF_2$. In this case, etchant feeding processes are performed so as to keep a constant measured $XeF_2$ concentration-indicating a constant etching rate.

After the sacrificial material is totally removed, the etching process can be terminated and the microstructure can be unloaded from the etch chamber.

After the removal of the sacrificial materials such as amorphous silicon, materials of the functional layers of the microstructure are left. Exemplary such materials of the functional layers comprises: elemental metals (e.g. Al, Au, Pt, and Cu) or metalloid (not Si, and Ge), metal alloys that comprises two or more elemental metals, intermetallic compounds (e.g. $Ni_x$-$Al_x$, $Ti_xAl_y$ and TiNi) and ceramics (but not WN). A ceramic is a compound wherein a metal (or metalloid) is bounded to a non-metal. The ceramics for the microstructures comprise transition metal nitride (e.g. $TiN_x$, $TaN_x$ and $CrN_x$), transition metal oxide (e.g. $TiO_x$, $TaO_x$ and $CrO_x$), transition metal carbide (e.g. $WC_x$, $TiC_x$, $TaC_x$ and $CrC_x$), transition metal oxynitride (e.g. $TiO_xN_y$, and $TaO_xN_y$), transition metal silicon nitride (e.g. $TiSi_xN_y$, and $TaSi_xN_y$), transition metal silicon oxynitride (e.g. $TiSiO_xN_y$, and $TaSiO_xN_y$), metalloid nitride (e.g. $SiN_x$), metalloid oxide (e.g. $SiO_x$), metalloid carbide (e.g. $SiC_x$), metalloid oxynitride (e.g. $SiO_xN_y$) or other ternary and higher compounds.

After the etching process, other optional processes, such as coating the microstructure with self-assembly-monolayer (SAM) material, can be performed after step 137. Specifically, at step 136, the etch chamber is pumped out to remove the gases from inside the etch chamber. The microstructure is unloaded from the etch chamber (step 138) and transferred into the SAM chamber (SAM chamber 114 in FIG. 5) at step 140. The SAM chamber is then filled with the SAM material (step 142) so as to coat the microstructure with the SAM material at step 144. After the coating, the microstructure is unloaded from the SAM chamber at step 146. In transferring the microstructure from one chamber (e.g. the etchant chamber) to another (e.g. the SAM chamber), a load-lock that connects the chambers is preferably employed. During a transfer from one chamber to another, the microstructure is unloaded from the first chamber and loaded into the load-lock before loading the microstructure into the second chamber.

In addition to SAM coating process, e.g. a plasma or wet etch may also be applied to the microstructure. Specifically, the breakthrough etch for removing the non-spontaneously-etchable films on the sacrificial materials is performed at breakthrough chamber 112 (in FIG. 5) at step 120 before etching the microstructure using spontaneous vapor phase $XeF_2$. After the completion of the breakthrough etch, the microstructure is unloaded from the breakthrough chamber and transferred into the etch chamber at step 122.

In the above discussed embodiments, the provisions of the spontaneous vapor phase etchant occur according to the measurements of the chemical species. The amount of the etchant provided per time unit varies. Specifically, the amounts of the etchant are different at different etchant provision processes. In an embodiment of the invention, the amount of the etchant is varied when a change in the measured parameter is beyond a predetermined value. The measured parameter can be selected from the concentration of the etchant (e.g. $XeF_2$), the concentration of an etch product (e.g. $SiF_4$), etching rate and surface area of the sacrificial materials inside the etch chamber.

In practice, microstructures are often fabricated in similar fabrication processes and at different times. Given this fact, rather than using the dynamically measured parameters from the detector to control the etching rate, appropriate historical data of the parameter(s) may also be used to control the etching rate. According to the invention, one or more parameters are recorded through out an etching process. For example, variations of the etching rate, concentration of the chemical species (e.g. the etchant, and the etch products), surface area of the sacrificial material and other parameters versus time are recorded. In addition, other derivative parameters may be extracted from the measured parameters and recorded. For example, dependencies of the etch rate or the concentration of the chemical specifies to the surface area of the sacrificial material during the etching process and the first derivative of the parameters (e.g. the concentration of the etch product) to the time may be extracted and are recorded. These measured parameters and/or the derived dependencies are then used to control the following etching process for the same or similar microstructures.

As a way of example, the time dependence of the concentration of $SiF_4$ is dynamically measured through out an etching process for removing amorphous silicon in a wafer of microstructures. This is accomplished by the detector. Then the time dependence of the amorphous silicon surface area through the etching process can be extracted.

In a following etch process for removing the same or similar wafer of microstructures, the time dependence of the amorphous silicon surface area can be used to the estimate the timing of the etchant recipe feedings and the amount of the etchant recipe in each feeding.

In the embodiments introduced above, the selected gas etchants are circulated via either the first loop or the second loop. As an alternative, the circulation of the etchant via the first loop or the second loop may be intermittent during the time interval between consecutive etchant feeding processes. This intermittent circulation profile may be determined ahead of the etching process. Specifically, the duration of each circulation via the first loop or the second loop, and the time interval between two consecutive complete circulations are predetermined.

In another alternative embodiment, the inner circulation is within the etch chamber. That is—the etchant (and the diluent gas) is circulated within the etchant chamber after an etchant feeding process. The circulation within the etch chamber may be accomplished by providing a fan or alike that activates and maintains the flow of the gases within the etch chamber. As an alternative, the etchant within the etch chamber is not circulated.

Figure 7:
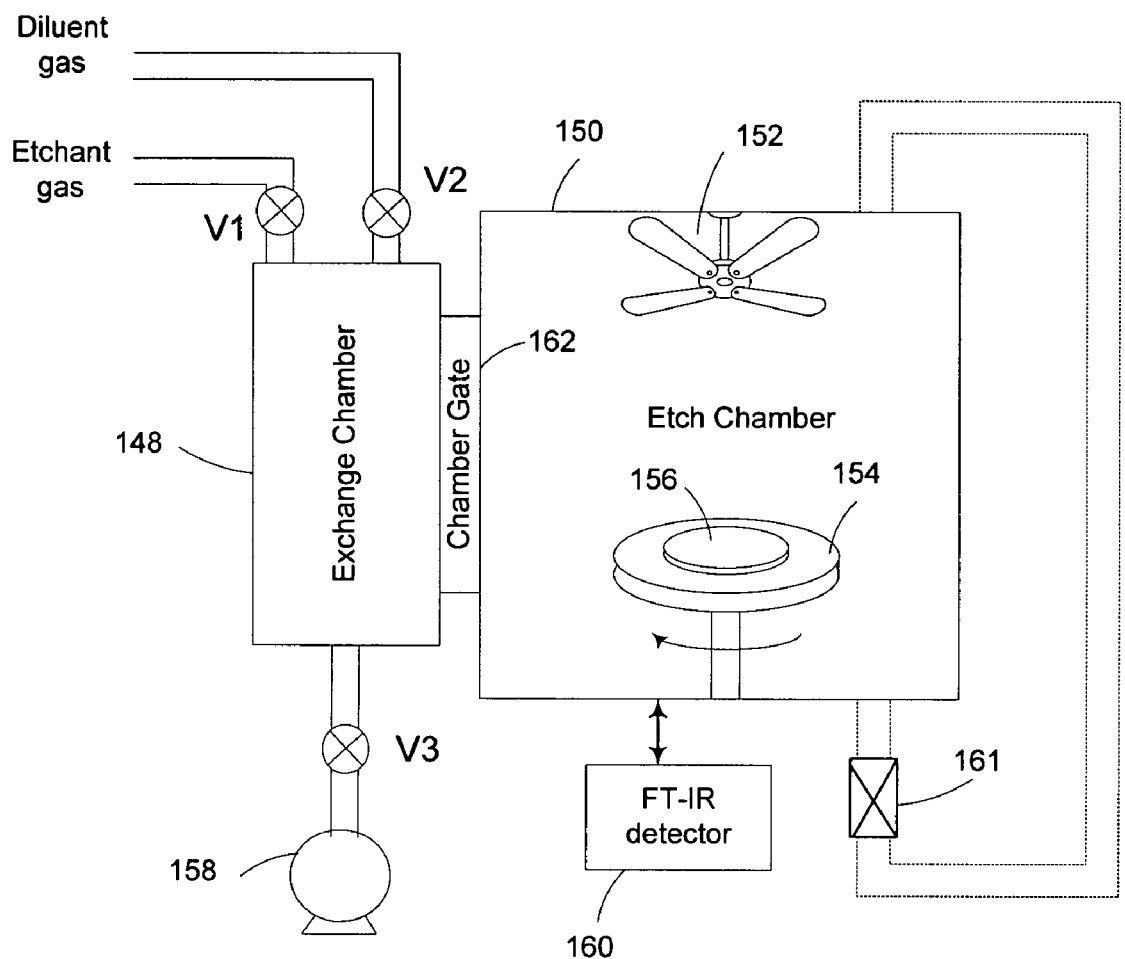
FIG. 7 is a diagram schematically illustrating a portion of an etching system according to an embodiment of the invention.

Referring to FIG. 7, a portion of an etching system according to yet another embodiment of the invention is illustrated therein. Exchange chamber 148 is connected to a diluent gas source and etchant gas source, which can be mixed properly inside the exchange chamber. Specifically, the partial pressure of the etchant gas within the gas mixture can be adjusted with an aid of pump 158 connected to the exchange chamber. Etch chamber 150 via chamber gate 162 that controls the gas flow from the exchange chamber into the etch chamber. This arrangement clearly benefits the etchant feeding speed from the exchange chamber to the etch chamber. In an embodiment of the invention, the etching sample (e.g. microstructure 156) is held by rotatable sample holder 154 such that the etching sample rotates along with the sample holder. As a result, the etchant gas can be uniformly distributed on the etching sample surface, and the sacrificial material within the etching sample can be uniformly removed. Alternatively, agitator 152, such as a fan, can be disposed proximate to the etching sample for agitating the etchant gas within the etch chamber.

The etching system may further comprises pump 161 that is connected to the exchange chamber for pumping out the gas mixture (including the etchant, the diluent gas and the etching products) out of the etch chamber.

As an alternative feature of the embodiment, detector 160, which is preferably a Fourier-Transformation Infra-Red detector, is provided for dynamically measure the concentration of the etchant (e.g. $XeF_2$) inside the etch chamber. The measured concentration of the etchant is analyzed (e.g. by a data processing unit, which is not shown) and used to control the etchant feeding processes so as to maintain a constant etching rate. For example, when the detector detects a decrease of the concentration of $XeF_2$ inside the etch chamber, an additional amount of $XeF_2$ (or a mixture of the amount of $XeF_2$ and a diluent gas) is fed into the etch chamber to balance the decrease.

It will be appreciated by those skilled in the art that a new and useful apparatus and method for removing sacrificial materials of microstructures have been described herein. In view of many possible embodiments to which the principles of this invention may be applied, however, it should be recognized that the embodiments described herein with respect to the figures are meant to be illustrative only and should not be taken as limiting the scope of invention. For example, those of skill in the art will recognize that the illustrated embodiments can be modified in arrangement and detail without departing from the spirit of the invention. For example, the sacrificial layers, if silicon, could also be removed by other spontaneous chemical vapor phase etchants, such as other noble gas halides or interhalogens (bromine trifluoride, bromine trichloride, etc.). For another example, a plurality of exchange chambers may be provided for feeding the etchant recipe. At each feeding cycle, one or more exchange chambers are selected to prepare the etchant recipe and feed the prepared etchant recipe into the etch chamber, whereas it is preferred that different exchange chambers are selected for prepared and feeding etchant recipes in successive feeding cycles. Therefore, the invention as described herein contemplates all such embodiments as may come within the scope of the following claims and equivalents thereof.

We claim:

1. A method comprising a process for processing a microstructure, said process comprising:
    loading the microstructure into an etch chamber of an etch system, wherein the microstructure comprises a sacrificial material and one or more structural materials; and
    etching the sacrificial material, further comprising:
    providing an amount of spontaneous vapor phase etchant recipe to the etch system;
    detecting an amount of a chemical species flowing out of the etch chamber resulting from etching of the sacrificial material from the present spontaneous vapor phase etchant recipe;
    measuring the amount of the chemical species in the process;
    determining a feeding time based on the measurement; and
    further etching the sacrificial material by providing an additional amount of the spontaneous vapor phase etchant recipe to the etch system based on the determined feeding time to continue the process, and wherein the chemical species is an etch product.

2. The method of claim 1, wherein the etchant recipe comprises vapor phase HF.

3. The method of claim 1, further comprising: coating the microstructure with a SAM material.

4. The method of claim 1, wherein the etchant has a pressure from 0 to 15 torr.

5. The method of claim 1, wherein the spontaneous vapor phase etchant recipe comprises a noble gas halide.

6. The method of claim 5, wherein the noble gas halide is xenon difluoride.

7. The method of claim 1, wherein the etchant recipe comprises a spontaneous interhalogen.

8. The method of claim 7, wherein the interhalogen comprises bromine trichloride or bromine fluoride.

9. The method of claim 1, wherein the step of providing the additional amount of the etchant is performed when a change of the measured amount of the chemical species over time is beyond a predetermined value.

10. The method of claim 9, wherein the predefined value is 20% of an initial etch rate or an initial surface area.

11. The method of claim 1, wherein the step of providing the spontaneous vapor phase etchant further comprises:
    preparing the etchant in an exchange chamber; and
    feeding the prepared etchant via an outer circulation loop that passes through the exchange chamber and an etch chamber in which the microstructure is held.

12. The method of claim 11, further comprising: opening the outer circulation loop for feeding another additional amount of the etchant into the etch system.

13. The method of claim 1, further comprising: repeating the steps of claim 1 until the measurement of the amount of the chemical species is equal to or below another predefined value.

14. The method of claim 13, wherein the predefined value is 1% of an initial etch rate or an initial surface area.

15. The method of claim 1, wherein the structural materials remain in the microstructure after the sacrificial materials are removed, wherein the structural material is selected from an elemental metal, a metalloid, an intermetallic compound and a ceramic material.

16. The method of claim 15, wherein the elemental metal is selected from Al, Cu and Pt.

17. The method of claim 15, wherein the intermetallic compound is selected from $Ti_xAl_x$ and TiNi.

18. The method of claim 15, wherein the ceramic material comprises a transition metal nitride, transition metal oxide, transition metal carbide, transition metal oxynitride, transition metal silicon nitride, transition metal silicon oxynitride, metalloid nitride, metalloid oxide, metalloid carbide, metalloid oxynitride.

19. The method of claim 1, wherein the etchant recipe comprises a diluent gas.

20. The method of claim 19, wherein the diluent gas is an inert gas that is selected from $N_2$, He, Ar, Kr and Xe.

21. The method of claim 19, wherein the diluent gas has a partial pressure from 20 to 700 torr.

22. The method of claim 21, wherein the diluent gas has a partial pressure from 50 to 100 torr.

23. The method of claim 19, wherein the diluent gas has a partial pressure from 500 to 700 torr.

24. The method of claim 19, wherein the diluent gas has a partial pressure around 100 torr.

25. A method comprising a process for processing a microstructure, said process comprising:
    loading the microstructure into an etch chamber of an etch system, wherein the microstructure comprises a sacrificial material and one or more structural materials; and
    etching the sacrificial material, further comprising:
    providing an amount of spontaneous vapor phase etchant recipe to the etch system;

detecting an amount of a chemical species flowing out of the etch chamber resulting from etching of the sacrificial material from the present spontaneous vapor phase etchant recipe;

measuring the amount of the chemical species in the process;

determining a feeding time based on the measurement;

further etching the sacrificial material by providing an additional amount of the spontaneous vapor phase etchant recipe to the etch system based on the determined feeding time to continue the process; and repeating the foregoing steps until the measurement of the amount of the chemical species indicates etch rate or an initial surface area is equal to or below 1% of an initial etch rate or an initial surface area.

26. The method of claim 25, wherein the etchant recipe comprises bromine trichloride or bromine fluoride.

27. The method of claim 25, wherein the etchant recipe comprises vapor phase HF.

28. The method of claim 25, wherein the etchant recipe comprises a diluent gas selected from $N_2$, He, Ar, Kr and Xe.

29. The method of claim 25, wherein the spontaneous vapor phase etchant recipe comprises a noble gas halide.

30. The method of claim 29, wherein the noble gas halide is xenon difluoride.

31. A method comprising a process for processing a microstructure, said process comprising:

loading the microstructure into an etch chamber of an etch system, wherein the microstructure comprises a sacrificial material and one or more structural materials; and etching the sacrificial material, further comprising:

providing an amount of spontaneous vapor phase etchant recipe to the etch system;

detecting an amount of a chemical species flowing out of the etch chamber resulting from etching of the sacrificial material from the present spontaneous vapor phase etchant recipe;

measuring the amount of the chemical species in the process;

determining a feeding time based on the measurement; and further etching the sacrificial material by providing an additional amount of the spontaneous vapor phase etchant recipe to the etch system based on the determined feeding time to continue the process, and wherein the step of providing the additional amount of the etchant is performed when a change of the measured amount of the chemical species over time is beyond a predetermined value indicating 20% of an initial etch rate or an initial surface area.

32. The method of claim 31, wherein the chemical species is an etchant of the etchant recipe.

33. The method of claim 31, wherein the etchant recipe comprises bromine trichloride or bromine fluoride.

34. The method of claim 31, wherein the etchant recipe comprises vapor phase HF.

35. The method of claim 31, wherein the etchant recipe comprises a diluent gas selected from $N_2$, He, Ar, Kr and Xe.

36. The method of claim 31, wherein the spontaneous vapor phase etchant recipe comprises a noble gas halide.

37. The method of claim 36, wherein the noble gas halide is xenon difluoride.

* * * * *